(12) United States Patent
Chih et al.

(10) Patent No.: US 10,475,490 B2
(45) Date of Patent: *Nov. 12, 2019

(54) MEMORY DEVICES WITH IMPROVED REFRESHING OPERATION

(71) Applicant: TAIWAN SEMICONDUCTOR MANUFACTURING CO., LTD., Hsinchu (TW)

(72) Inventors: Yue-Der Chih, Hsinchu (TW); Cheng-Hsiung Kuo, Jhubei (TW); Gu-Huan Li, Zhubei (TW); Chien-Yin Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 4 days.

This patent is subject to a terminal disclaimer.

(21) Appl. No.: 15/728,375

(22) Filed: Oct. 9, 2017

(65) Prior Publication Data
US 2018/0033471 A1    Feb. 1, 2018

Related U.S. Application Data

(63) Continuation of application No. 15/250,212, filed on Aug. 29, 2016, now Pat. No. 9,812,182, which is a
(Continued)

(51) Int. Cl.
*G11C 7/20* (2006.01)
*G11C 11/406* (2006.01)
(Continued)

(52) U.S. Cl.
CPC .................. *G11C 7/20* (2013.01); *G11C 5/02* (2013.01); *G11C 11/1659* (2013.01);
(Continued)

(58) Field of Classification Search
CPC ..... G11C 7/20; G11C 11/406; G11C 11/1659; G11C 13/0033; G11C 13/0064;
(Continued)

(56) References Cited

U.S. PATENT DOCUMENTS

| 6,751,127 B1 | 6/2004 | Chou et al. |
| 7,139,194 B2 | 11/2006 | Fukuoka |

(Continued)

FOREIGN PATENT DOCUMENTS

| CN | 1501405 A | 6/2004 |
| CN | 1540670 A | 10/2004 |

(Continued)

OTHER PUBLICATIONS

U.S. Office Action issued in U.S. Appl. No. 14/881,492, dated Mar. 10, 2016.
(Continued)

*Primary Examiner* — David Lam
(74) *Attorney, Agent, or Firm* — Maschoff Brennan

(57) ABSTRACT

A memory device includes memory cells and a refresh module. The memory cells are coupled to a bit line, in which at least one memory cell of the memory cells is configured to store predetermined data. The refresh module is configured to refresh the at least one memory cell if a target memory cell of the memory cells is programmed or erased, in order to keep at least one cell current of the at least one memory cell away from a predetermined verify current level.

20 Claims, 5 Drawing Sheets

Related U.S. Application Data continuation of application No. 14/881,492, filed on Oct. 13, 2015, now Pat. No. 9,455,006, which is a continuation of application No. 14/067,907, filed on Oct. 30, 2013, now Pat. No. 9,208,847.

(51) Int. Cl.
| | | |
|---|---|---|
| *G11C 11/16* | (2006.01) | |
| *G11C 13/00* | (2006.01) | |
| *G11C 5/02* | (2006.01) | |

(52) U.S. Cl.
CPC ........ *G11C 11/1677* (2013.01); *G11C 11/406* (2013.01); *G11C 13/0033* (2013.01); *G11C 13/0064* (2013.01); *G11C 13/0069* (2013.01); *G11C 2013/0076* (2013.01)

(58) Field of Classification Search
CPC ... G11C 11/1677; G11C 5/02; G11C 13/0069; G11C 2013/0076
USPC ..... 365/222, 185.18, 185.29, 185.21, 185.23
See application file for complete search history.

(56) References Cited

U.S. PATENT DOCUMENTS

| | | | |
|---|---|---|---|
| 7,697,359 B2 | 4/2010 | Lee | |
| 8,000,142 B1 | 8/2011 | Montierth et al. | |
| 8,098,537 B2 | 1/2012 | Mokhlesi | |
| 8,938,655 B2* | 1/2015 | Hamilton | G11C 16/10 365/185.01 |
| 9,208,847 B2 | 12/2015 | Chih et al. | |
| 9,455,006 B2* | 9/2016 | Chih | G11C 11/406 |
| 9,904,436 B2* | 2/2018 | Zadeh | G06F 3/0482 |
| 2003/0235080 A1 | 12/2003 | Yaegashi et al. | |
| 2005/0162921 A1 | 7/2005 | Kurihara | |
| 2007/0109157 A1 | 5/2007 | Lee et al. | |
| 2009/0207666 A1* | 8/2009 | Park | G11C 16/349 365/185.25 |

FOREIGN PATENT DOCUMENTS

| | | |
|---|---|---|
| CN | 102067233 A | 5/2011 |
| CN | 102834870 A | 12/2012 |
| JP | H0927199 A | 1/1997 |
| JP | 2807203 B2 | 10/1998 |
| KR | 20040000330 A | 4/2004 |
| KR | 20080025992 A | 3/2008 |

OTHER PUBLICATIONS

U.S. Notice of Allowance issued in U.S. Appl. No. 14/881,492, dated Jun. 7, 2016.

* cited by examiner

MEMORY DEVICES WITH IMPROVED REFRESHING OPERATION

RELATED APPLICATIONS

This application is a continuation of U.S. application Ser. No. 15/250,212, filed Aug. 29, 2016, which is a continuation of U.S. application Ser. No. 14/881,492 (now U.S. Pat. No. 9,455,006), filed Oct. 13, 2015, which is a continuation of U.S. application Ser. No. 14/067,907 (now U.S. Pat. No. 9,208,847), filed Oct. 30, 2013, all of which are herein incorporated by reference.

BACKGROUND

Memory cells in a memory device are programmed or erased in accordance with user's demands. When a memory cell is programmed or erased, high voltages are applied on a bit line and a word line of the memory cell to enable the memory cell to store a logic data "0" or "1". When the memory cell is read, an output current or a threshold voltage of the memory cell is detected to obtain the logic data stored in the memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
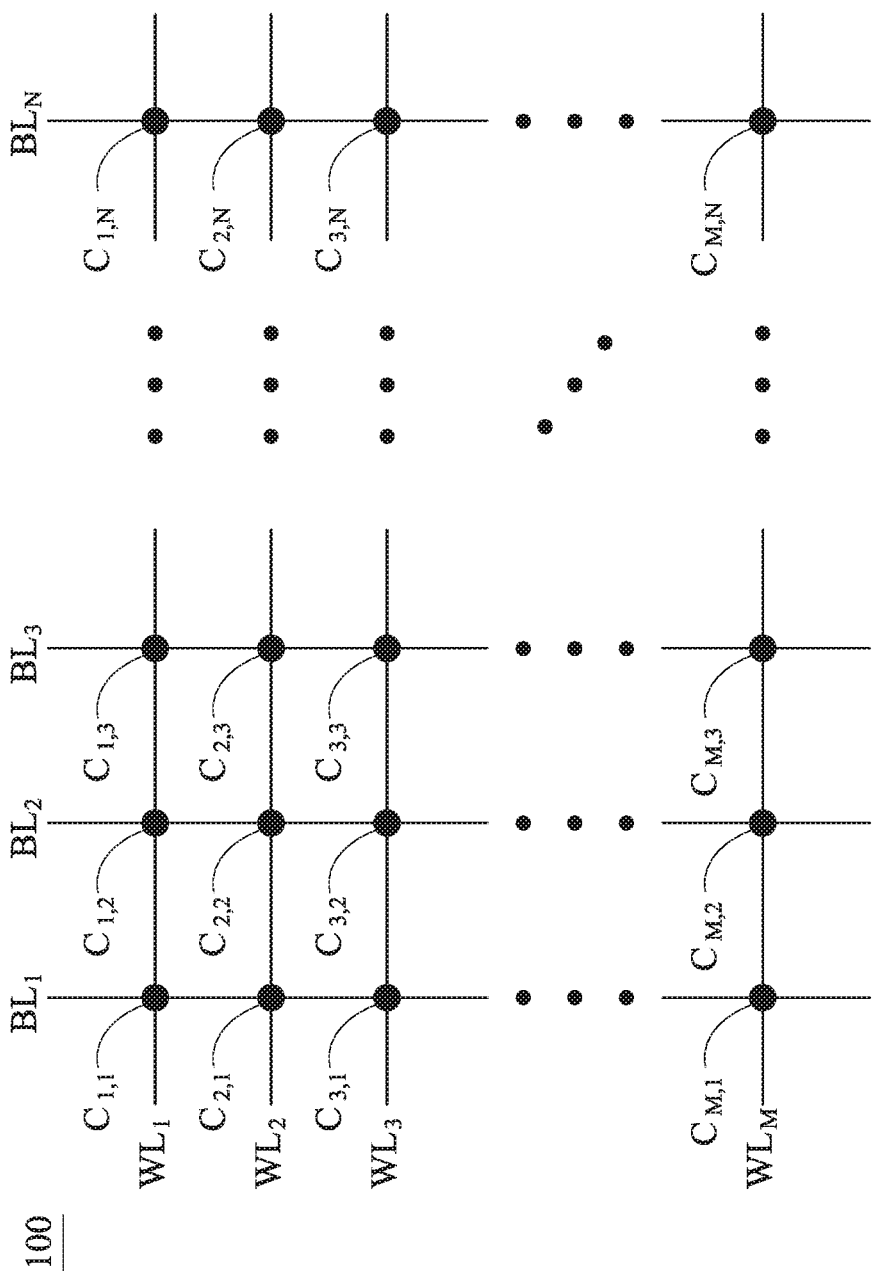
FIG. 1 is a circuit diagram showing configuration a memory cell array of a non-volatile memory device according to some embodiments of the present disclosure.

FIG. 1 is a circuit diagram showing the arrangement of a memory cell array 100 of a non-volatile memory device according to some embodiments of the present disclosure. The non-volatile memory device is, for illustration, a resistive random access memory (RRAM) or electrically erasable and programmable read-only memory (EEPROM), but not limited thereto. The memory cell array 100 includes memory cells $C_{1,1}$-$C_{M,N}$ arranged in lines of a matrix. The lines include bit lines $BL_1$-$BL_N$ and word lines $WL_1$-$WL_M$. Each one of the memory cells $C_{1,1}$-$C_{M,N}$ is electrically connected to a corresponding one of the bit lines $BL_1$-$BL_N$ and a corresponding one of the word lines $WL_1$-$WL_M$. For example, the memory cell $C_{1,1}$ is electrically connected to the bit line $BL_1$ and the word line $WL_1$. Explained in a different way, the memory cells $C_{1,1}$-$C_{M,N}$ are located at respective intersections of the bit-lines $BL_1$-$BL_N$ and word-lines $WL_1$-$WL_M$.

Figure 2:
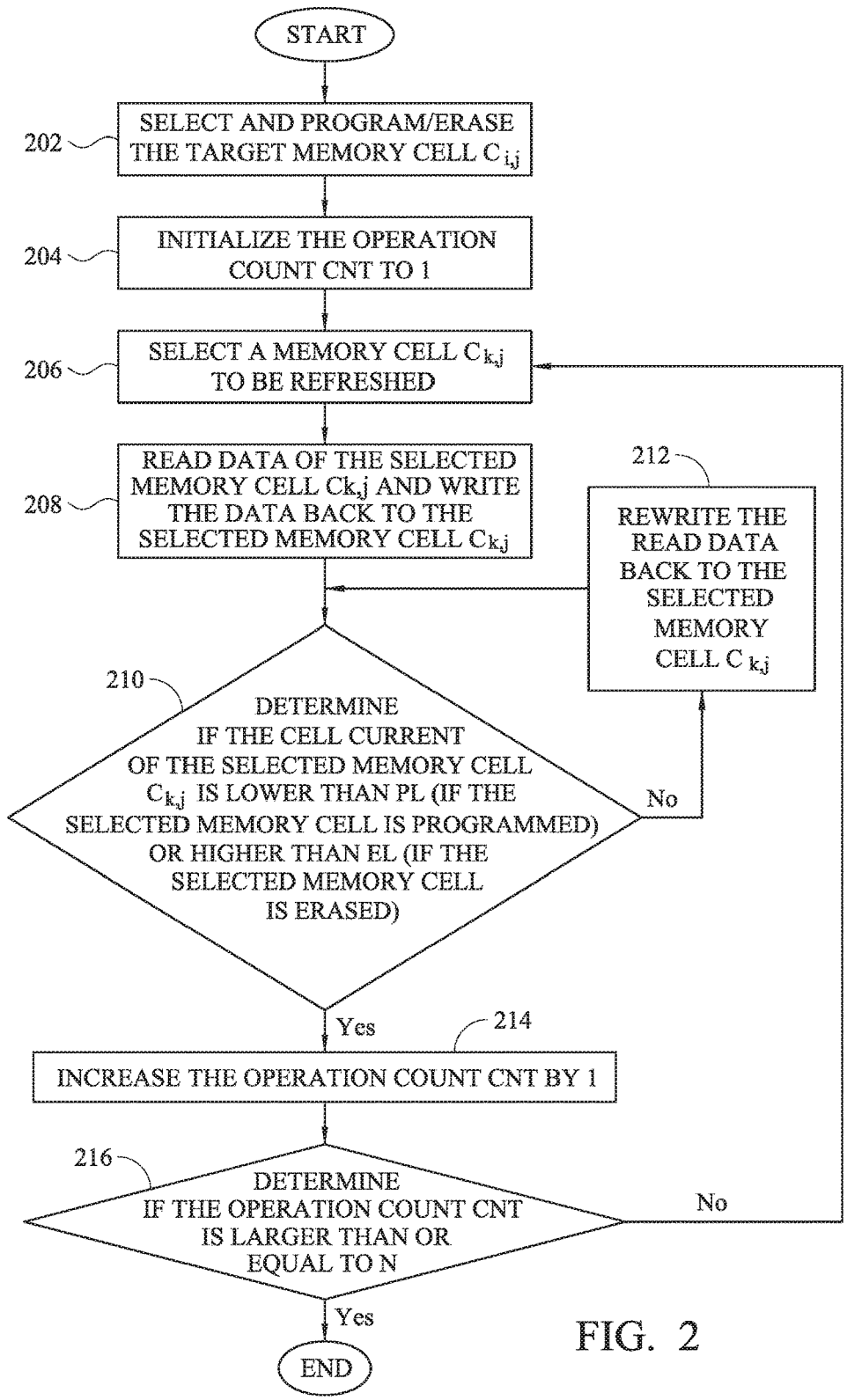
FIG. 2 is a flowchart showing steps for programming and erasing memory cells of the memory cell array shown in FIG. 1 with refreshing operation.

FIG. 2 is a flowchart showing a method 200 for programming/erasing a memory cell with a refreshing operation. The method 200 shown in FIG. 2 is applied for controlling the memory cells $C_{1,1}$-$C_{M,N}$ of the memory cell array 100 shown in FIG. 1. For illustration, the operations of the memory cell array 100 in FIG. 1 are described below with reference to the method 200.

Referring to FIG. 2, the method 200 begins at operation 202. In operation 202, a target memory cell $C_{i,j}$ of the memory cells $C_{1,1}$-$C_{M,N}$ is selected and then programmed/erased. When the target memory cell $C_{i,j}$ is programmed/erased, selecting voltages $V_B$, $V_W$ are respectively applied on the bit line $BL_j$ and the word line $WL_i$. For illustration, when the target memory cell $C_{1,1}$ is programmed/erased, selecting voltages $V_B$, $V_W$ are respectively applied on the bit line $BL_1$ and the word line $WL_1$.

In some embodiments, if the program operation is to be performed on the target memory cell $C_{i,j}$, the selecting voltages $V_B$, $V_W$ are both set to be high-level voltages HV. In some other embodiments, if the erase operation is to be performed on the target memory cell $C_{i,j}$, the selecting voltage $V_B$ is set to be the high-level voltage HV, while the selecting voltage $V_W$ is set to be a low-level voltage LV.

In some embodiments of the present disclosure, the high-level voltage HV and the low-level voltage LV are, for example, 7.8 V and 0 V, respectively. The values of the high-level voltage HV and the low-level voltage LV are given for illustrative purposes. Other values of the high-level voltage HV and the low-level voltage LV are within the contemplated scope of the present disclosure. Illustratively, the high-level voltage HV and the low-level voltage LV may be correspondingly adjusted according to various embodiments.

In operation 204, an operation count CNT is initialized to be 1. The operation count CNT is related to the number of refreshed memory cells among the memory cells $C_{1,1}$-$C_{M,N}$. For illustration, the operation count CNT is related to the number of refreshed memory cells from the memory cells $C_{1,1}$-$C_{M,1}$ on the bit line $BL_1$.

In operation 206, the memory cell $C_{k,j}$, electrically connected to the bit line $BL_j$ and the word line $WL_k$, is selected. The word line $WL_k$ is different from the word line $WL_i$. For illustration, the memory cell $C_{2,1}$ electrically connected to the bit line $WL_1$ and the word line $WL_2$ is selected.

In operation 208, data stored in the selected memory cell $C_{k,j}$ are read, and then the read data are written back to the memory cell $C_{k,j}$. For illustration, the data stored in the selected memory cell $C_{2,1}$ is read and then written back to the selected memory cell $C_{2,1}$.

In operation 210, if the selected memory cell $C_{k,j}$ is a programmed memory cell and that whether the cell current of the selected memory cell $C_{k,j}$ is lower than a programmed cell verifying current cell PL is determined, or if the selected memory cell $C_{k,j}$ is an erased memory cell and that whether the cell current of the selected memory cell $C_{k,j}$ is higher than an erased cell verifying current cell EL is determined. For illustration, if the selected memory cell $C_{k,j}$ is a programmed memory cell, the programmed cell verifying current level PL is provided. Then, whether the cell current of the memory cell $C_{k,j}$ is lower than the programmed cell verifying current level PL is determined. Further, if the memory cell $C_{k,j}$ is an erased memory cell, the erased cell verifying current level EL is provided. Then, whether the cell current of the memory cell $C_{k,j}$ is higher than the erased cell verifying current level EL is determined. For illustration, the selected memory cell $C_{2,1}$ is electrically connected to the bit line $WL_1$ and the word line $WL_2$.

In the case that the selected memory cell $C_{k,j}$ is programmed, when the cell current of the selected memory cell $C_{k,j}$ is higher than or equal to the programmed cell verifying current level PL, operation 212 is performed. In operation 212, the read data of the selected memory device $C_{k,j}$ is written to the selected memory device $C_{k,j}$. After operation 212, operation 210 is performed again. The data of the selected memory cell $C_{k,j}$ is re-written until the cell current of the selected memory cell $C_{k,j}$ is lower than the programmed cell verifying current level PL. For illustration, the selected memory cell $C_{2,1}$ is electrically connected to the bit line $WL_1$ and the word line $WL_2$.

In the case that the selected memory cell $C_{k,j}$ is erased, when the cell current of the selected memory cell $C_{k,j}$ is lower than or equal to the erased cell verifying current level EL, operation 212 is performed. After operation 212, operation 210 is performed again. The data of the selected memory cell $C_{k,j}$ is re-written until the cell current of the memory cell $C_{k,j}$ is higher than the erased cell verifying current level EL. For illustration, the selected memory cell $C_{2,1}$ is electrically connected to the bit line $WL_1$ and the word line $WL_2$.

Otherwise, if the determination result in operation 210 is that the cell current of the programmed memory cell $C_{k,j}$ is lower than the programmed cell verifying current level PL or the cell current of the erased memory cell $C_{k,j}$ is higher than the erased cell verifying current level EL, operation 214 is performed.

Operations 208-212 are performed to refresh the data stored in the selected memory cell $C_{k,j}$. As a result, that the cell current of the programmed memory cell $C_{k,j}$ is ensured to be lower than the programmed cell verifying current level PL, or the cell current of the erased memory cell $C_{k,j}$ is ensured to be higher than the erased cell verifying current level EL.

In operation 214, the operation count CNT is increased by 1.

In operation 216, whether the operation count CNT is larger than or equal to N is determined. If the operation count CNT is smaller than N, operation 206 is performed again. For illustration, the coefficient k is increased by 1 (i.e., k=k+1), and then the memory cell $C_{k,j}$ electrically connected to the bit line $BL_j$ and to the word line $WL_k$ is selected.

On the other hand, if the operation count CNT is larger than or equal to N, the method 200 ends. It means that all memory cells $C_{1,j}$-$C_{M,j}$ on the same bit line $BL_j$ except the target memory cell $C_{i,j}$ are all refreshed.

Figure 3A:
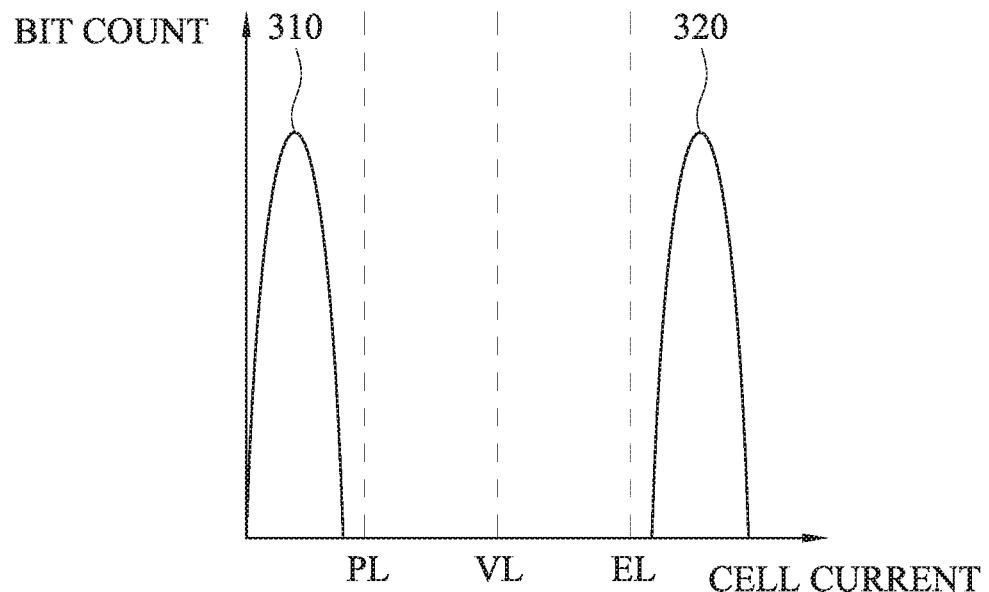
FIGS. 3A-3C are schematic diagrams illustrating bit count distribution curves corresponding to cell current values across memory cells of the memory cell array shown in FIG. 1.
Figure 3B:
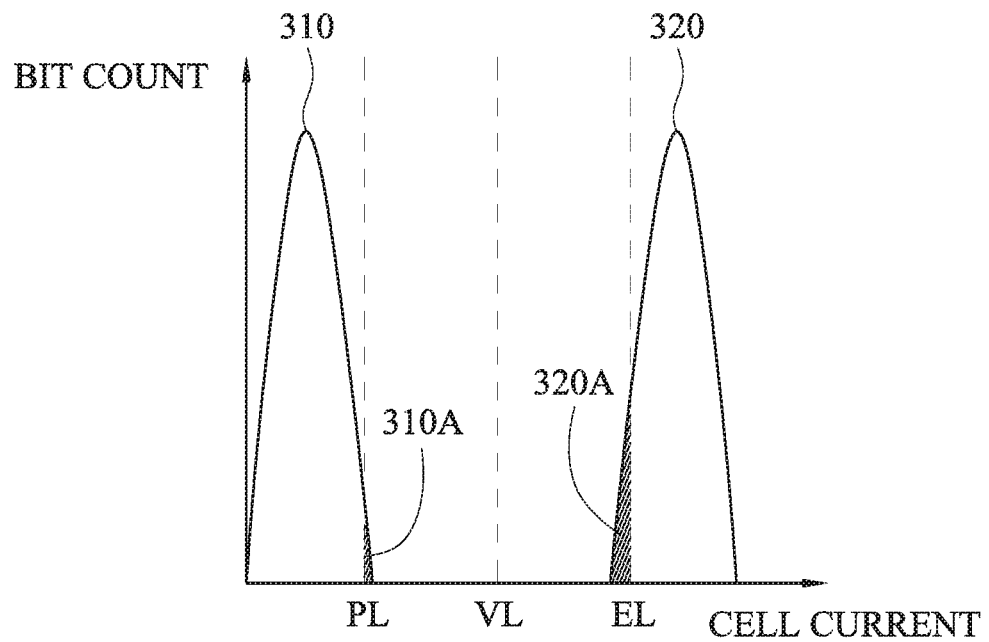
Figure 3C:
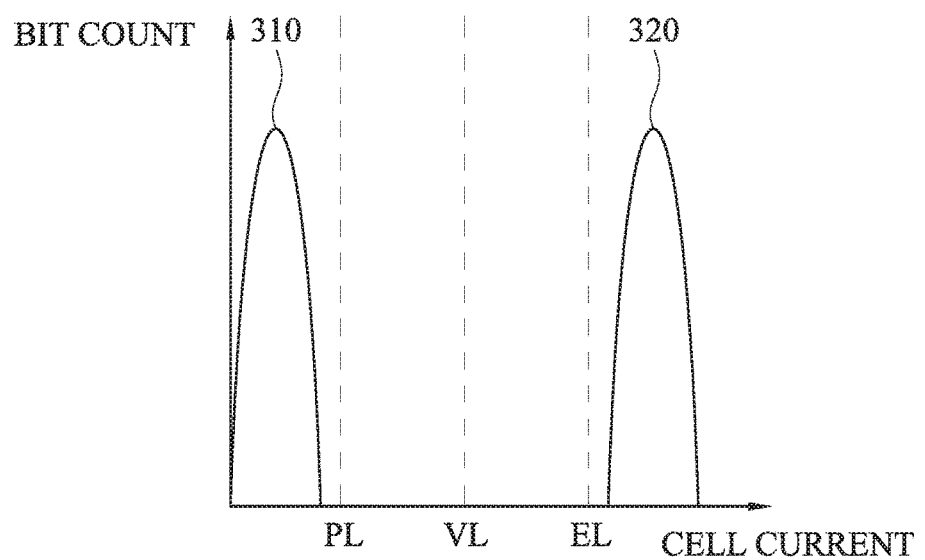

FIGS. 3A-3C are graphs illustrating bit count distribution curves corresponding to cell current values across memory cells $C_{1,1}$-$C_{M,N}$ of the memory cell array 100 shown in FIG. 1. In FIG. 3A, before programming/erasing a target memory cell, an initial bit count distribution corresponding to cell current values across the memory cells of the memory cell array 100 is represented by two distribution curves 310 and 320.

The distribution curve 310 corresponds to the programmed memory cells storing logical data "0". The cell currents of the programmed memory cells corresponding to the distribution curve 310 are all lower than the verifying current level VL. The distribution curve 320 corresponds to erased memory cells storing a logical data "1". The cell currents of the erased memory cells corresponding to the distribution curve 320 are all higher than the verifying current level VL. Also, the programmed cell verifying current level PL and an erased cell verifying current level EL are set to be criteria. The verifying current level VL, the programmed cell verifying current level PL and the erased cell verifying current level EL are predetermined.

In order to keep sufficient read margin and ensure that the distribution curves 310 and 320 are not expanded over the verifying current level VL, the cell currents of the programmed memory cells corresponding to the distribution curve 310 shall be lower than the programmed cell verifying current level PL, and the cell currents of the erased memory cells corresponding to the distribution curve 320 shall be higher than the erased cell verifying current level EL.

In some embodiments, the verifying current level VL is 20 μA, the programmed cell verifying current level PL is 10 μA, and the erased cell verifying current level EL is 40 μA. The values of the verifying current level VL, the programmed cell verifying current level PL and the erased cell verifying current level EL are given for illustrative purposes. Other values are within the contemplated scope of the present disclosure. Note that, the verifying current level VL, the programmed cell verifying current level PL and the erased cell verifying current level EL are correspondingly adjusted according to various embodiments.

After programming/erasing memory cells for several times, the width of the distribution curves 310 and 320 are enlarged due to cell current degradation. As shown in FIG. 3B, the width of the distribution curve 310 extends over the programmed cell verifying current level PL, and the width of the distribution curve 320 extends over the erased cell verifying current level EL. The cell currents of the memory cells in the over-extended areas 310A and 320A include the cell currents that need to be adjusted. The method 200 shown in FIG. 2 is used to decrease the cell currents in the over-extended area 310A to be lower than the programmed cell verifying current level PL, and to increase the cell currents in the over-extended area 320A to be higher than the erased cell verifying current level EL.

As shown in FIG. 3C, after the method 200 is performed, the cell currents of the distribution curve 310 are all restricted to be lower than the programmed cell verifying current level PL, and the cell currents of the distribution curve 320 are all restricted to be higher than the erased cell verifying current level EL. Since the programmed cell verifying current level PL is lower than the verifying current level VL and the erased cell verifying current level EL is higher than the verifying current level VL, the programmed and erased memory cells are correctly verified.

By using the method 200 of the present disclosure, refreshing operations are performed on the memory cells after memory cell programming/erasing operation to eliminate the cell current degradation. Since the cell current degradation is eliminated, the memory cells are correctly verified as programmed/erased memory cells, and the condition of erroneous verification is avoided. Consequently, the endurance of the memory device is improved.

In addition, after the refreshing operations of the method 200, all cell currents of the programmed memory cells is adjusted to be lower than the programmed cell verifying current level PL, and all cell currents of the erased memory cells is adjusted to be higher than the erased cell verifying current level EL. Hence, larger read margin of the memory device is achieved.

Illustratively, the above embodiments uses the cell current of the memory cell to determine if the data of the memory cell is correctly written. In some embodiments of the present disclosure, the cell voltage of the memory cell is used to determine if the data of the cell memory cell is correctly written. For illustration, in some embodiments of the present disclosure, the operation 210 used to determine the cell current of the memory cell is replaced by an operation used to determine the cell voltage of the memory cell. In the operation of verifying the cell voltage of the memory cell, a predetermined verifying voltage level for programmed cells or a predetermined verifying voltage level for erased memory cells are provided, and then the predetermined verifying voltage level is compared with the cell voltage of the memory cell to determine if the data of the memory cell is correctly written.

Figure 4:
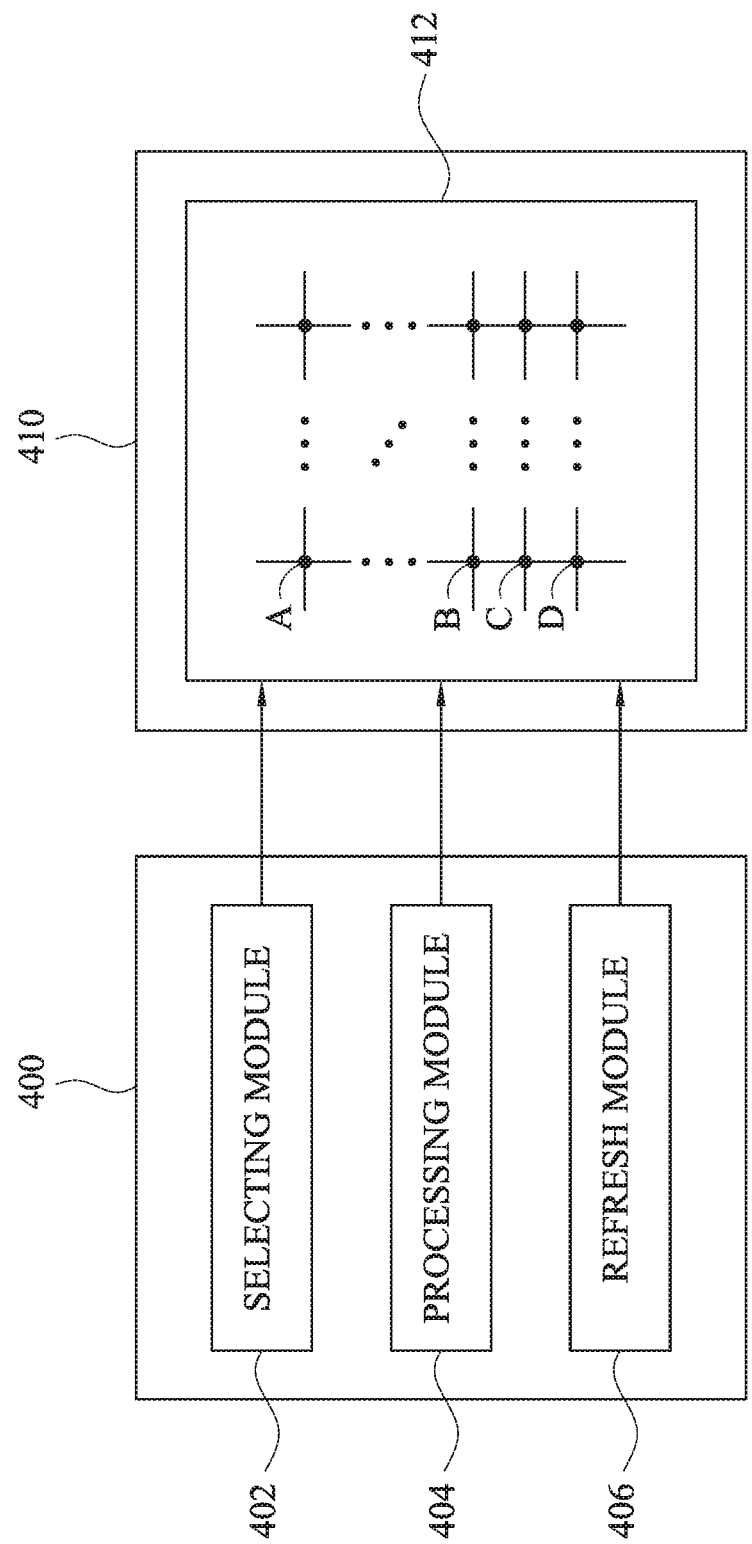
FIG. 4 is a schematic diagram showing a system for programming and erasing memory cells with refreshing operation according to some embodiments of the present disclosure.

Referring to FIG. 4, a system 400 for programming and erasing memory cells with refreshing operation is provided in accordance with some embodiments of the present disclosure. The system 400 is electrically connected to a memory device 410 and configured to control the memory device 410. In some embodiments, the system 400 is configured to perform the method 200 illustrated in FIG. 2. In other words, the system 400 performs program/erase and refreshing operations on the memory cells such as cells A, B, C and D in the memory device 410. For illustration, the memory device 410 is a non-volatile memory device, such as resistive random access memory or electrically erasable and programmable read-only memory, but not limited thereto. The memory device 410 includes a memory cell array 412, in which the memory cells are arranged in lines of a matrix.

The system 400 includes a selecting module 402, a processing module 404 and a refresh module 406. The selecting module 402 is configured to select a target memory cell A that is to be programmed/erased in the memory cell array 412. The processing module 404 is configured to program/erase the target memory cell A. When the target memory cell A is to be programmed, the processing module 404 inputs the high-level voltages HV into the bit line and the word line both electrically connected to the target memory cell A. When the target memory cell A is to be erased, the processing module 404 inputs the high-level voltage HV into the bit line, and inputs the low-level voltage LV into the word line.

The refresh module 406 is configured to refresh the memory cells in the same line (bit line or word line) as the target memory cell A. In some embodiments, all memory cells except the target memory cell A in the same bit line are to be refreshed (e.g., memory cells B, C and D). For example, the refresh module 406 performs the operations 208-212 to refresh the memory cell D. Data stored in the memory cell D are read, and then the read data are written back to the memory cell D. The refresh module 406 determines if the cell current of the memory cell D is lower than programmed cell verifying current level PL when the memory cell D is a programmed memory cell, or determines if the cell current of the memory cell D is higher than the erased cell verifying current level EL when the memory cell D is an erased memory cell.

In the case that the memory cell D is programmed, when the refresh module 406 determines that the cell current of the memory cell D is higher than or equal to the programmed cell verifying current level PL, the refreshing operation (e.g., the operations 208-212) is to be performed again to refresh the memory cell D. Explained in a different way, the data stored in the memory cell D are reread, and then the reread data are rewritten back to the memory cell D. The data of the memory cell D continues to be re-written until the refresh module 406 determines that the cell current of the memory cell D is lower than the programmed cell verifying current level PL.

In the case that the memory cell D is erased, when the refresh module 506 determines that the cell current of the memory cell D is lower than or equal to the erased cell verifying current level EL, the refreshing operation is to be performed again to refresh the memory cell D. Explained in a different way, the data stored in the memory cell D are reread, and then the re-read data are rewritten back to the memory cell D. The data of the memory cell D continues to be re-written until the refresh module 406 determines that the cell current of the memory cell D is higher than the erased cell verifying current level EL.

The present disclosure is not restricted to performing the refreshing operation on memory cells electrically connected to the same bit line to which the target memory cell is electrically connected. For illustration, in some embodiments, the refreshing operation is alternatively performed on memory cells electrically connected to the same word line to which the target memory cell is electrically connected. Alternatively, the refreshing operation is performed on all memory cells in the same memory cell array.

In accordance with some embodiments, the present disclosure discloses a memory device that includes memory cells and a refresh module. The memory cells are coupled to a bit line, in which at least one memory cell of the memory cells is configured to store predetermined data. The refresh module is configured to refresh the at least one memory cell if a target memory cell of the memory cells is programmed or erased, in order to keep at least one cell current of the at least one memory cell away from a predetermined verify current level.

In accordance with another embodiments, the present disclosure discloses a memory device that includes memory cells and a refresh module. The memory cells are coupled to a bit line, in which at least one memory cell of the memory cells is configured to store predetermined data, and the at least one memory cell corresponds to a distribution curve that is associated with a read margin. The refresh module is configured to refresh the at least one memory cell if a target memory cell of the memory cells is programmed or erased, in order to refrain a width of the distribution curve from expanded.

In accordance with yet another embodiments, the present disclosure discloses a method includes following operations. A target memory cell is programmed or erased. A memory cell storing predetermined data corresponding to a distribution curve that is associated with a read margin is refreshed, in order to refrain a width of the distribution curve from expanded, in which the memory cell is location-related with the target memory cell.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory device, comprising:
a plurality of memory cells coupled to a bit line, wherein at least one memory cell of the plurality of memory cells is configured to store predetermined data; and
a refresh module configured to refresh the at least one memory cell if a target memory cell of the plurality of memory cells is programmed or erased, to keep at least one cell current of the at least one memory cell at a level different from a predetermined verify current level.

2. The memory device of claim 1, wherein the refresh module is further configured to read the predetermined data from the at least one memory cell and then rewrite the predetermined data back to the at least one memory cell, to refresh the at least one memory cell.

3. The memory device of claim 1, wherein if the at least one memory cell is a programmed memory cell, the refresh module is further configured to determine if a current level of the at least one memory cell is lower than a programmed verifying current level.

4. The memory device of claim 3, wherein the refresh module is further configured to refresh the at least one memory cell if the current level of the at least one memory cell is higher than or equal to the programmed verifying current level.

5. The memory device of claim 1, wherein if the at least one memory cell is an erased memory cell, the refresh module is further configured to determine if a current level of the at least one memory cell is higher than an erased verifying current level.

6. The memory device of claim 5, wherein the refresh module is further configured to refresh the at least one memory cell if the current level of the at least one memory cell is lower than or equal to the erased verifying current level.

7. The memory device of claim 1, further comprising:
a selecting module configured to select the at least one memory cell from the plurality of memory cells to be programmed or erased; and
a processing module configured to apply a selecting voltage to the at least one memory cell, in order to program or erase the at least one memory cell.

8. A memory device, comprising:
a plurality of memory cells coupled to a bit line,
wherein at least one memory cell of the plurality of memory cells is configured to store predetermined data, and the at least one memory cell corresponds to a distribution curve that is associated with a read margin; and
a refresh module configured to refresh the at least one memory cell at least by rewriting the predetermined data to the at least one memory cell, if a target memory cell of the plurality of memory cells is programmed or erased, in order to refrain a width of the distribution curve from expanding.

9. The memory device of claim 8, wherein if the at least one memory cell is a programmed memory cell, the refresh module is configured to refresh the at least one memory cell if a voltage level of the at least one memory cell is higher than or equal to a predetermined verifying voltage level, or if a current level of the at least one memory cell is higher than or equal to a predetermined verifying current level.

10. The memory device of claim 8, wherein if the at least one memory cell is an erased memory cell, the refresh module is configured to refresh the at least one memory cell if a voltage level of the at least one memory cell is lower than or equal to a predetermined verifying voltage level, or if a current level of the at least one memory cell is lower than or equal to a predetermined verifying current level.

11. The memory device of claim 8, further comprising:
a selecting module configured to select the at least one memory cell from the plurality of memory cells to be programmed or erased; and
a processing module configured to apply a selecting voltage to the at least one memory cell, in order to program or erase the at least one memory cell.

12. A method, comprising:
programming or erasing a target memory cell; and
refreshing a memory cell storing predetermined data corresponding to a distribution curve that is associated with a read margin, at least by rewriting the predetermined data to the memory cell, to refrain a width of the distribution curve from expanding,
wherein the memory cell and the target memory cell are associated with a data line.

13. The method of claim 12, wherein the memory cell and the target memory cell are coupled to a bit line.

14. The method of claim 12, wherein if the memory cell is a programmed memory cell, refreshing the memory cell comprises:
determining if a voltage level of the memory cell is lower than a predetermined verifying voltage level or a current level of the memory cell is lower than a predetermined verifying current level.

15. The method of claim 14, wherein the memory cell is refreshed if the voltage level of the memory cell is higher than or equal to the predetermined verifying voltage level, or if the current level of the memory cell is higher than or equal to the predetermined verifying current level.

16. The method of claim 12, wherein if the memory cell is an erased memory cell, refreshing the memory cell comprises:
    determining if a voltage level of the memory cell is higher than a predetermined verifying voltage level or a current level of the memory cell is higher than a predetermined verifying current level.

17. The method of claim 16, wherein the memory cell is refreshed if the voltage level of the memory cell is lower than or equal to the predetermined verifying voltage level, or if the current level of the memory cell is lower than or equal to the predetermined verifying current level.

18. The method of claim 12, further comprising initializing an operation count.

19. The method of claim 18, further comprising:
    increasing the operation count if a voltage level of the memory cell is lower than a predetermined verifying voltage level; and
    determining if the memory cell is checked in accordance with the operation count.

20. The method of claim 18, further comprising:
    increasing the operation count when a current level of the memory cell is lower than a predetermined verifying current level; and
    determining if the memory cell is checked in accordance with the operation count.

* * * * *